United States Patent [19]
Milkovic

[11] Patent Number: 4,535,287
[45] Date of Patent: Aug. 13, 1985

[54] ELECTRONIC WATT/WATTHOUR METER WITH AUTOMATIC ERROR CORRECTION AND HIGH FREQUENCY DIGITAL OUTPUT

[75] Inventor: Miran Milkovic, Scotia, N.Y.

[73] Assignee: General Electric Company, Somersworth, N.H.

[21] Appl. No.: 478,717

[22] Filed: Mar. 25, 1983

[51] Int. Cl.³ .......................... G01R 21/06; G01R 1/02
[52] U.S. Cl. ..................................... 324/142; 324/107; 324/130
[58] Field of Search ............... 324/142, 130, 127, 107; 330/9; 364/483

[56] References Cited

U.S. PATENT DOCUMENTS

| | | | |
|---|---|---|---|
| 2,877,308 | 3/1959 | Reiner et al. | 330/9 |
| 3,955,138 | 5/1976 | Milkovic | 324/142 |
| 4,054,835 | 10/1977 | Los et al. | 324/130 |

Primary Examiner—Ernest F. Karlsen
Attorney, Agent, or Firm—Robert E. Brunson

[57] ABSTRACT

An improved solid state semiconductor integrated circuit electronic watt/watthour meter circuit having analog and high frequency digital outputs with automatic error correction. The meter comprises first and second transformers for developing first and second voltage and current indicating signals for supply to a multiplier circuit that multiplies the two signals together and derives an output analog product signal representative of the instantaneous power being supplied by a source of electric energy. A multiplier low pass filter circuit is coupled to the output from the multiplier circuit for deriving from the product signal an average value power signal V. An analog-to-pulse rate converter is supplied with the average value power signal V and serves to convert it into a high frequency train of output signal pulses wherein each output signal pulse represents a predetermined quantized amount of electric energy. An automatic offset error correction circuit comprising polarity reversing switches is responsive to the output from the analog-to-pulse rate converter for automatically switching the polarity of the average value power signal V supplied to the analog-to-pulse rate converter midway through the quantizing period of the analog-to-pulse rate converter to cause an up/down integration of the average value power signal V over each quantizing period of operation and simultaneously producing a sequential addition/subtraction of like polarity offset error signals over each quantizing period of operation to thereby cancel out the offset error signals automatically.

13 Claims, 3 Drawing Figures

ELECTRONIC WATT/WATTHOUR METER WITH AUTOMATIC ERROR CORRECTION AND HIGH FREQUENCY DIGITAL OUTPUT

TECHNICAL FIELD

This invention relates to electronic watt/watthour meter circuits of the type which can be fabricated in solid state semiconductor integrated circuit form and which can provide a local readout of either instantaneous watts or watthours by use of a suitable indicator connected to the circuit, and/or can be used for remote readout from a central office facility using a computer.

More specifically, the invention relates to electronic watt/watthour meter circuits of the above general type which provide automatic error correction together with a high frequency output pulse rate for facilitating the measurement of electric power in a relatively short time of about one-half (½) second or less.

BACKGROUND PRIOR ART

U.S. Pat. No. 3,875,508, issued Apr. 1, 1975, entitled "Metering Electrical Energy (KWH) In Single Phase System"—Miran Milkovic, inventor—assigned to the General Electric Company, describes an electronic kilowatt hour meter which employs many of the principles used in the present invention and which operates to generate high frequency output pulses from the output of an analog-to-pulse rate converter comprising a part of the meter. The system described in this patent, however, does not include automatic error correction for automatically correcting system offset errors, which failing tends to limit the overall dynamic operating range of the metering system disclosed in this prior art patent.

U.S. Pat. No. 3,955,138, issued May 4, 1976, for an "Electric Energy Consumption Meter With Input Transformer Having Single Resistance Terminated Secondary Winding Coupled To C-MOS Switches Driven By Pulse Width Modulated Control Signals'-'—Miran Milkovic, inventor, and assigned to the General Electric Company, describes an electronic watt-/kilowattt hour meter of the same general type as those discussed above, but which includes automatic error correction capability. The metering system described in pending U.S. patent application Ser. No. 330,660, filed Dec. 14, 1981, now U.S. Pat. No. 4,485,343, entitled "Electronic Watt and Watthour Meters With Analog and Digital Outputs And Having Automatic Error Correction", Miran Milkovic, inventor, and assigned to the General Electric Company, also describes a metering system which includes automatic error correction. The two metering systems described in U.S. Pat. No. 3,955,138 and in U.S. application Ser. No. 330,660 each are limited in their frequency of output pulses which they can derive for metering purposes, however, due to the effect of a superimposed $2\omega t$ component in the multiplier output on the integrator ramp voltage of the analog-to-pulse rate converter, the output pulse rate of these circuits is limited. This characteristic consequently limits the time period required for the metering circuit to generate output metering pulses. In order to overcome these shortcomings of the prior art metering circuits, the present invention was devised.

SUMMARY OF INVENTION

It is therefore a primary object of the present invention to provide a new and improved electronic watt-/watthour meter having automatic error correction and providing high frequency digital readout of power being measured whereby it is possible to obtain power readings within a time frame of one-half a second or less.

Another object of the invention is to provide an electronic watt/watthour meter having the above set forth characteristics and which is capable of being manufactured in solid state, semiconductor integrated circuit form at relatively low cost.

A still further object of the invention is to provide a solid state semiconductor, integrated circuit, electonic watt/watthour meter having the above characteristics which can be employed to read power in polyphase as well as in single phase power systems.

In practicing the invention an improved electronic watt/watthour meter circuit having analog and high frequency digital outputs with automatic error correction, is provided. The improved metering circuit comprises first transformer means having a primary winding for connection to a source of electric energy for excitation and response to either the electric current or the electric voltage supplied from the source of electric energy and a secondary winding for providing a first signal proportional thereto. Second transformer means are provided having a primary winding for connection to the source of electric energy for excitation in response to the other of the electric current or electric voltage supplied from the source of electric energy and a secondary winding for providing a second signal proportional thereto. Multiplier circuit means are provided for receiving and multiplying the first and second signals together and deriving an output product signal representative of the instantaneous power being supplied by the source of electric energy. The multiplier circuit means comprises comparator means for receiving the first signal and a triangular waveshape sampling signal from a sampling signal source and deriving a pulse width modulated switching signal. Multiplier switching circuit means are provided which are responsive to and controlled by the pulse width modulated switching signal and have the second signal supplied from the second transformer means applied to an input thereof for providing at its output a pulse width modulated and amplitude modulated product signal of the first and second signals and representative of the instantaneous power being supplied by the source of electric energy. Multiplier low pass filter circuit means are coupled to the output from the multiplier circuit means for deriving from the pulse width modulated and amplitude modulated product signals an average value power signal V where V=VI COS O where V is the load voltage I is the load current and O is the load impedance phase angle.

Analog-to-pulse rate converter means are responsive to the average value power signal V from the multiplier low pass filter circuit means for summing and integrating the average value power signal V and converting it into a high frequency train of output signal pulses wherein in each output signal pulse represents a predetermined quantized amount of electric energy. A digital indicator of kilowatt hours of energy can be coupled to the output from this analog-to-pulse rate converter means to provide a local readout of the kilowatt hours of power and/or the output from the analog-to-pulse rate converter means may be supplied over suitable telephone lines to a metering computer located in a central office facility. If desired, instantaneous watts can be readout by reading the output of the multiplier low pass filter circuit means to provide either a local indication of instantaneous watts or a remote indication at the central facility for demand metering purposes.

Automatic offset error correction circuit means are responsive to the output from the analog-to-pulse rate converter means for automatic addition/subtraction averaging of system offset error signals during each quantizing period of operation of the analog-to-pulse rate converter means. The automatic offset error correction circuit means comprises polarity reversing switching means coupled intermediate the output from the multiplier low pass filter circuit means and the input to the analog-to-pulse rate converter means. The polarity reversing switching means are responsive to the output from the analog-to-pulse rate converter means for automatically switching the polarity of the average value power signal V supplied to the input to the analog-to-pulse rate converter means midway through the quantizing period of the analog-to-pulse rate converter means and for supplying unlike polarity, average value power signals +V and −V during respective half cycles of the quantizing period to cause an up/down integration of the average value power signal V over each quantizing period of operation of the analog-to-pulse rate converter means and simultaneously producing a sequential addition/subtraction of like polarity offset error signals over each quantizing period of operation to thereby cancel out the offset error signals automatically. The metering circuit may be employed in polyphase power systems as well as single phase systems.

BRIEF DESCRIPTION OF DRAWINGS

These and other objects, features and many of the attendant advantages of this invention will be more fully appreciated as the same becomes better understood from a reading of the following detailed description, when considered in connection with the accompanying drawings, wherein like parts in each of the several figures are identified by the same reference characters, and wherein.

BEST MODE OF PRACTICING INVENTION

Figure 1:
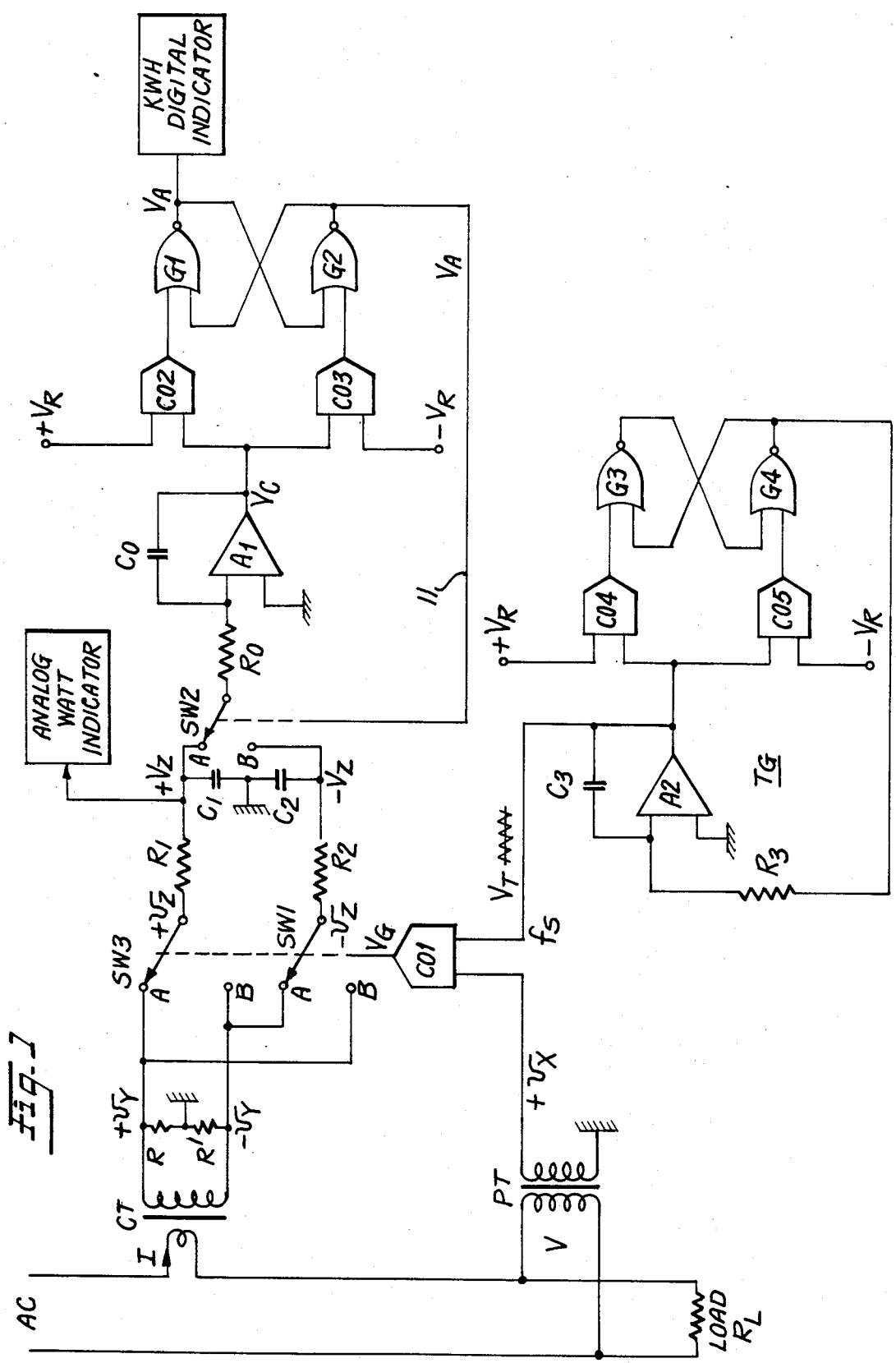
FIG. 1 is a schematic circuit diagram of a new and improved solid state semiconductor, integrated circuit, electronic watt/watthour metering circuit according to the present invention.

FIG. 1 is a schematic electrical circuit diagram of one form of solid state watt/watthour meter with analog and high frequency digital outputs and automatic error correction, constructed according to the invention. In FIG. 1 first transformer means are provided by a voltage transformer PT having a primary winding supplied from a source of electric energy and excited by the voltage V available from the source. A secondary winding is inductively coupled to the primary winding and has one end grounded with the opposite end thereof identified by the potentials +vx connected to one input to a comparator circuit CO of conventional construction. Comparator CO1 has applied to a remaining input terminal thereof a triangular waveshape sampling signal VT and supplied from a triangular waveshape generator TG comprised by comparators CO4, CO5, gates G3 and G4, operational amplifier A2, resistor R3 and capacitor C3. The sampling signal VT has a frequency fs which is much greater than that of the frequency of the supply line voltage V applied to the primary winding of voltage transformer PT. As described more fully in U.S. Pat. No. 3,947,763, issued Mar. 30, 1976, entitled "CMOS Electronic KWH Meter And Method For Metering Electric Energy"—Miran Milkovic, inventor, the disclosure of which is hereby incorporated in its entirety into the disclosure of this application, comparator CO1 develops at its output a pulse width modulated switching signal VG which is applied to the input switching terminals of solid state double pole, single throw switches SW1 and SW3. Switches SW1 and SW3 under the control of comparator CO1 constitute a multiplier circuit means for receiving and multiplying current and voltage signals together and deriving an output product signal representative of the instantaneous power being supplied by a source of electric energy being monitored. For this purpose, switches SW1 and SW3 each have two fixed input contacts A and B and an output derived from the moveable contact. Switches SW1 and SW3 while illustrated as manually operated switches in fact constitute solid state switching elements of the type disclosed in the above-referenced U.S. Pat. No. 3,947,763. The fixed contact A of SW1 and fixed contact B of SW3 are connected via a center tap resistor R to the upper end of the secondary winding of a current transformer CT whose primary winding is supplied with a current I representative of the current being supplied from the source of electric energy being monitored. The lower end of the secondary winding and center tap resistor R is connected in common to the fixed contact B of switch SW3 and contact A of switch SW1. By this arrangement the conductive condition of the multiplier switches SW1 and SW3 is switched at the sampling signal rate fs to develop output pulse width modulated-amplitude modulated product signals +vz and −vz. The center tap resistor R comprises a set of series connected, matched fixed resistor R and R' connected across the secondary winding of current transformer T with their midpoint being connected to ground.

The pulse width modulated and amplitude modulated output product signals +vz and −vz represent the instantaneous product of vx and vy and hence are representative of the instantaneous power being supplied by the power source as explained more fully in the above-referenced U.S. Pat. No. 3,947,763. The instantaneous product signals +vz and −vz are supplied to a low pass filter comprised by $R_1C_1$ and $R_2C_2$, respectively, which develop at their outputs respective average value power signals +Vz and −Vz where Vz=VI Cos $\theta$, V is the load voltage, I is the load current and $\theta$ is the load impedance angle.

The average power output signals +Vz or −Vz are supplied through polarity reversing switching means SW2 (comprising a part of an automatic offset error correction scheme to be described more fully hereafter) to the input of an integrator circuit comprised by fixed resistor RO, operational amplifier A1 and feedback capacitor CO. The integrator RO, A1, CO, integrates the sampled product signal down until its output VC reaches the reference voltage −VR applied to one of the input terminals of a comparator CO3 which in conjunction with comparator CO2 and NAND gates G1 and G2 constitutes a flip-flop that reverse the polarity of its output upon VC reaching the value −VR. The output of flip-flop CO2, CO3, G1, G2 is a digital output signal VA which is supplied back through a conductor 11 to control the polarity of switch SW2 and hence the polarity of the average power signal Vz supplied to the integrator RO, A1, CO. Thus each time the flip-flop is reset, the polarity of VA is reversed and since switch SW2 is controlled by VA, the polarity of the average power signal Vz supplied to the integrator RO, A1, CO, is reversed thus reversing the polarity of the output signal VC so that it becomes minus (negative) and the integrator circuit RO, A1, CO starts to integrate up until its output VC reaches +VR to reset the flip-flop and return the circuit to its original starting condition. From this description, it will be appreciated that the integrator RO, A1, CO together with the flip-flop constitutes a summing type analog-to-pulse rate converter whose basic function is to sum and to integrate the average power output signals +Vz and −Vz and to convert them into an output pulse train, wherein each output pulse represents a predetermined quantized amount of energy. A suitable Kilowatt-hour indicator is supplied with the pulses VA for summing and displaying the KWH of energy being consumed. Alternatively, the pulses VA may be supplied to a computer or other system for quantizing and measuring power. A suitable measurement of the power being consumed in watts can be obtained from the output of low pass filter R1C1.

In the prior art metering circuits described in the above-noted patents and pending applications, the instantaneous power product signals +vz and −vz have been supplied directly to the input to the integrator circuit RO, A1, CO. The instantaneous power product signals +vz and −vz by their nature have superimposed 2ωt components that are present in the input voltage and current indicating signals vx and vy at the load voltage frequency and which limit speed of operation of the integrator circuit RO, A1, CO. By filtering the instantaneous power product signals +vz and −vz and employing in their stead the average power signal +Vz and −Vz, the 2ωt component is eliminated so that integrator RO, A1, CO can be made to function at a much faster rate compatible with providing power measurements within a response time of one-half second or less.

Automatic offset error correction is provided by feeding back the output signal VA from the output of the analog-to-pulse rate converter over a feedback conductor 11 to control polarity switching of the switch SW2. As noted above, upon the output from the integrator voltage VC reaching the reference voltage −VR, the flip-flop changes state and causes the switch SW2 to be switched from the connection shown in solid line where it is closed on contact SW2-A to the reverse setting whereby it will become closed on SW2-B. This results in reversing the polarity of the average power signal Vz supplied to the input to the integrator. Automatic offset error correction is accomplished by the up/down integration averaging operation on a system wide basis. The integrator in the analog-to-pulse rate converter integrates up the average power signal Vz during one-half the time interval of the quantizing period while simultaneously adding the total offset error signal. Upon the flip-flop switching SW2 thereby reversing the polarity setting of switch SW2, the integrator starts to integrate down the reverse polarity Vz signal in the next intervening or remaining time interval of the quantizing period so that in effect the two Vz signal components are added. However, the total offset error signal voltages and currents of the operational amplifiers do not change their polarity when the average power output signal is switched in polarity midway through the quantizing period. Consequently, the offset error signal is in fact subtracted during the second interval of the quantizing period. Thus the total offset error is corrected out automatically over the complete quantizing period TQ=TU+TD. For a more complete description of this automatic offset correction, reference is made to the above-noted U.S. Pat. No. 3,955,138 and to an article appearing in the International Journal of Electronics, 1980, Vol. 48, No. 3, pages 257–269, the disclosure of which is hereby incorporated into this disclosure in its entirety.

Figure 2:
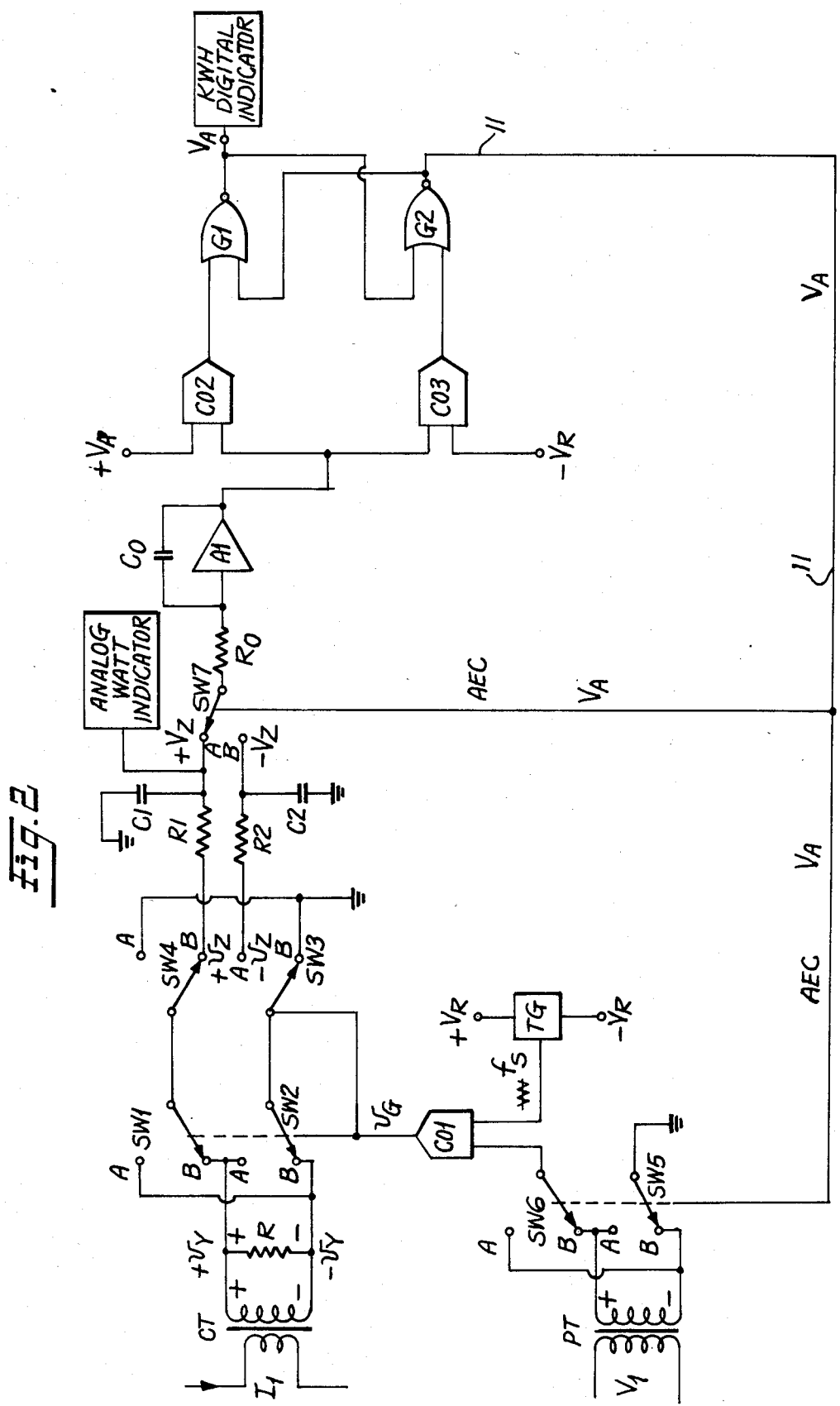
FIG. 2 is a schematic circuit diagram of an alternative form of improved electronic watt/watthour metering circuit according to the invention.

FIG. 2 is a schematic electrical circuit diagram of an improved electronic watt and watthour solid state semiconductor meter circuit having high frequency digital output according to the invention which uses a single polarity current transformer and voltage transformer for input purposes. The advantage of the circuit of FIG. 2 is that it does away with the need for a center tapped secondary winding in the input transformer or for the inclusion of matched center tapped resistors across the secondary winding of the current transformer with a consequent savings in the ability to use lower cost components, etc. as described more fully in the above-referenced U.S. Pat. No. 3,955,138. This savings in cost is achieved with an increase in the number of switching elements required from three to seven as illustrated in FIG. 2. In FIG. 2, like components have been given the same reference numerals or letters which were employed with the corresponding components in the circuit of FIG. 1.

The FIG. 2 circuit operates in the following manner. The voltage vy appears across the fixed resistor R with the indicated instantaneous polarities shown. With the switches set in the manner shown in the drawings, the lower end of the resistor R is maintained at ground potential. Consequently, point SW1-B is at the potential vy and vz on contact B of switch SW4 is positive as is the voltage vz appearing across low pass filter capacitor C1. It should be noted at this point that the switches SW1 through SW4 are switching on and off at the sampling frequency fs so that the voltage vz is intermittent and both pulse width modulated and amplitude modulated. Consequently, an average voltage value +Vz or −Vz is built up across filter capacitors C1 and C2 during the alternate quantizing periods which is of the same magnitude but opposite polarity as shown.

With the switches SW1–SW7 set as shown in solid line in FIG. 2, the integrator RO, A1, CO will integrate down until its output voltage VC reaches −VR. At this moment, the flip-flop CO2, CO3, G1, G2 switches state and reverse the polarity of VA. This results in switching SW5, SW6 and SW7 to the opposite polarity with their switchable contacts closed on the opposite set of fixed contacts aand results in changing the polarity of vx and the polarity of the output width modulated control voltage vg supplied to control SW1–SW4 switching action as well as the polarity of vz supplied to filter capacitors C1 and C2 during the remaining half interval of the quantizing period. Consequently, capacitor C1 and/or C2 will be charged to the respective +Vz or −Vz value shown. Since Vz supplied through SW7 has changed its polarity to −Vz, the integrator RO, A1, CO will commence to integrate up until it reaches the value +VR where it will again cause the flip-flop to change state. At this point, the summing analog-to-pulse rate converter comprised by the integrator and the flip-flop again reverses the polarity of voltage VA and thus returns switches SW5, SW6 and SW7 to their originally set condition. It will be appreciated therefore that the circuit operates to generate high frequency output pulses VA which are not limited by a superimposed 2ωt component (in a manner similar to the circuit described with relation to FIG. 1) but with the further advantage that only single polarities of vY and vX input signals are needed which simplifies the current transformer construction and reduces its cost. Additionally, the power dissipation in the fixed resistor R across the current transformer secondary winding is reduced considerably.

Figure 3:
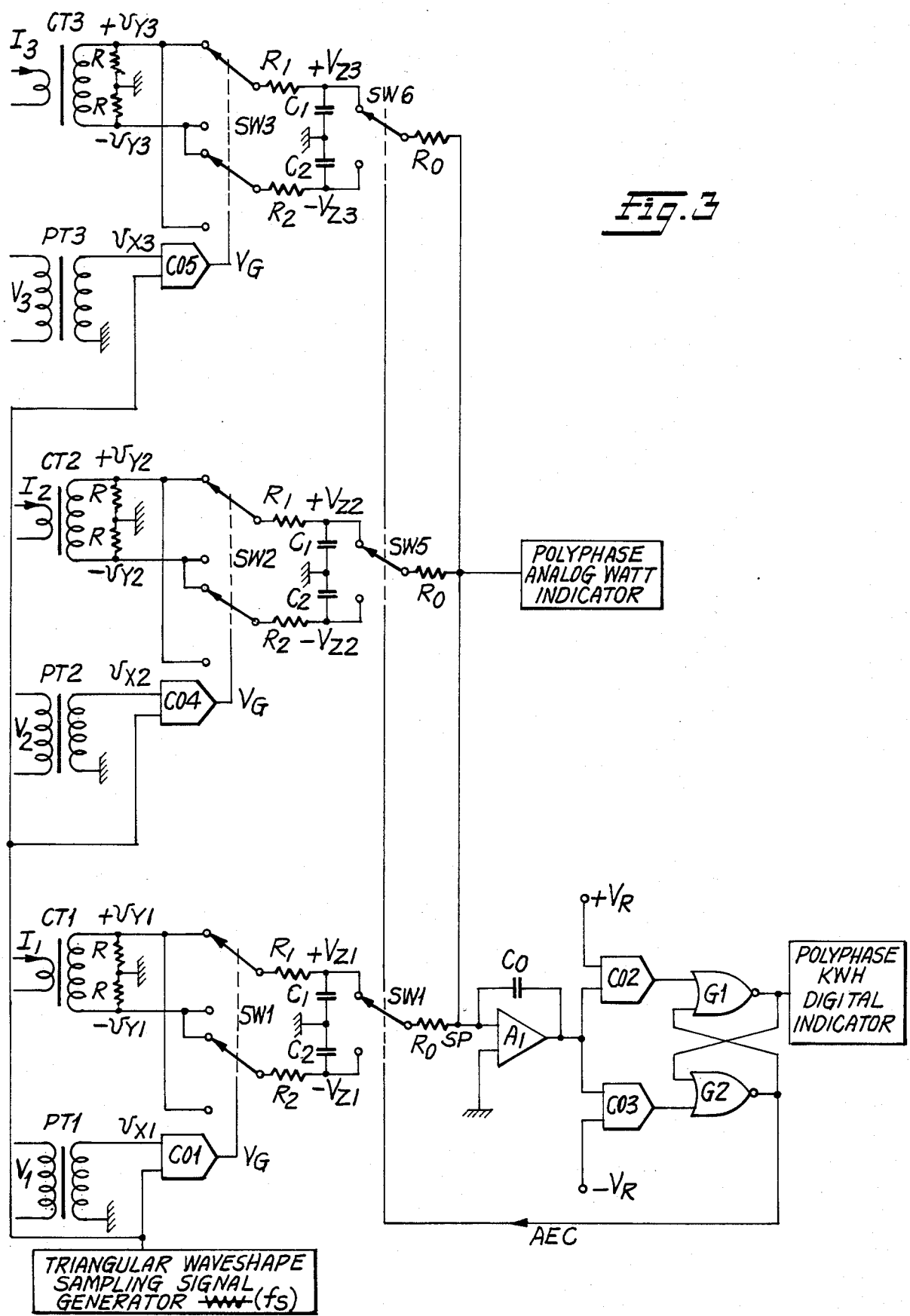
FIG. 3 is a schematic circuit diagram of a polyphase power circuit employing a new and improved metering circuit according to the invention and constructed in the manner shown in FIG. 1 of the drawings.

FIG. 3 is a schematic circuit diagram of a polyphase electronic solid state semiconductor watt/watthour meter circuit constructed according to the invention and which employs the basic circuit shown in FIG. 1 of the drawings in each of the phases. As described with respect to FIG. 1, each phase includes first and second input transformers for supplying first and second signals proportional to the voltage and current, respectively, for processing by respective multiplier circuit means for each phase comprised by comparator and multiplier switching circuits for each phase. The multiplier switching circuits provide respective pulse-width-modulated and amplitude modulated product signals proportional to watts to respective multiplier low pass filter circuit means that develop an average value power signal Vz for each phase for supply thru respective output polarity reversing switching elements SW4, SW5 and SW6 to a common summing analog-to-pulse rate converter.

The polyphase circuit of FIG. 3 utilizes a common triangular waveform signal generator TG which supplies a triangular waveform sampling signal having a sampling frequency fs to all of the comparators CO1, CO4 and CO5 for each of the phases. The common summing analog-to-pulse rate convert is comprised by an integrator circuit A1, CO and flip-flops CO2, CO3, G1, G2 together with the respective summing resistors RO. The summing resistors RO respectively couple the outputs from the polarity reversing switch elements SW4, SW5 and SW6 of the respective phases to the common summing analog-to-pulse rate converter. The output from the common analog-to-pulse rate converter controls operation of switch elements SW4, SW5 and SW6. The summing resistors Ro also serve to couple the respective analog outputs of the different phases to the input of a polyphase analog watt indicator. The output from the common analog-to-pulse rate converter is supplied to a polyphase KWH digital indicator, if desired, or alternately may be supplied over a suitable communication link to a computer or other readout device located at a central monitoring office.

In operation, the polyphase circuit of FIG. 3 functions in essentially the same manner as was described with relation to FIG. 1 of the drawings to develop the respective analog average value power signals Vz representative of watts being supplied to each of the phases across the summing resistors RO to develop a combined analog average value power signal Vz for the polyphase system. The combined average value power signal for all of the phases is processed by the common summing analog-to-pulse rate converter to develop a high frequency digital output signal representative of kilowatt hours of electrical energy being supplied by the source being monitored. Automatic error correction in the manner described with relation to FIGS. 1 and 2 is obtained by supplying the output from the common summing analog-to-pulse rate converter back over the feedback conductors 11 to the polarity reversing elements SW4, SW5 and SW6 for the respective phases.

From the foregoing description it will be appreciated that the invention makes available a new and improved electronic solid state semiconductor watt/watthour meter circuit providing both analog and high frequency digital outputs in a circuit configuration which also provides automatic offset error correction of system-wide offset voltages and currents produced in the metering circuit. The improved metering circuit can be embodied in either single phase or polyphase systems and provides an analog signal proportional to watts for use in demand metering and a high frequency digital output signal proportional to kilowatt hours of electrical energy whereby it is possible to obtain power metering readings within a time frame of one-half second or less.

INDUSTRIAL APPLICABILITY

This invention relates to electronic solid state semiconductor watt/watthour meter circuits for use in demand metering by electric utilities and for billing out to customers of the utility the total quantities of electrical energy consumed in kilowatt hours. The meter circuit can provide either local or remote readout or both.

Having described several embodiments of a new and improved electronic solid state semiconductor combined watt/watthour metering circuit having analog and high frequency digital outputs with automatic error correction according to the invention, it is believed that other modifications, variations and changes in the metering circuit will be suggested to those skilled in the art in the light of the above teachings. It is therefore to be understood that changes may be made in the particular embodiments of the invention disclosed which are within the full intended scope of the invention as defined by the appended claims.

What is claimed is:

1. An improved electronic watt/watthour meter circuit having analog and high frequency digital outputs with automatic error correction comprising:
    first transformer means having a primary winding for connection to a source of electric energy for excitation in response to either the electric current or the electric voltage supplied from the source of electric energy and a secondary winding for providing a first signal proportional thereto;
    second transformer means having a primary winding for connection to the source of electric energy for excitation in response to the other of the electric current or electric voltage supplied from the source of electric energy and a secondary winding for providing a second signal proportional thereto;
    multiplier circuit means for receiving and multiplying said first and second signals together and deriving an output product signal representative of instantaneous power being supplied by the source of electric energy;
    said multiplier circuit means comprising comparator means for receiving said first signal and a sampling signal from a sampling signal source and deriving a pulse width modulated switching signal, and a multiplier switching circuit means responsive to and controlled by said pulse width modulated switching signal and having the second signal supplied to an output thereof for providing at its output a pulse width modulated and amplitude modulated product signal of the first and second signals and representative of the instantaneous power being supplied by the source of electric energy;

multiplier low pass filter circuit means coupled to the output from said multiplier circuit means for deriving from the pulse width modulated and amplitude modulated product signal an average value power signal V where V=VI Cos θ where V is the load voltage, I is the load current and θ is the load impedance phase angle;

analog-to-pulse rate converter means responsive to the average value power signal V from said multiplier low pass filter circuit means for summing and integrating the average value power signal V and converting it into a high frequency train of output signal pulses wherein each output signal pulse represents a predetermined quantized amount of electric energy;

automatic offset error correction circuit means responsive to the output from said analog-to-pulse rate converter means for automatic addition/subtraction averaging of system offset error signals during each quantizing period of operation of the analog-to-pulse rate converter means, said automatic offset error correction circuit means comprising polarity reversing switching means coupled intermediate the output from the multiplier low pass filter circuit means and the input to the analog-to-pulse rate converter means, the polarity reversing switching means being responsive to the output from the analog-to-pulse rate converter means for automatically switching the polarity of the average value power signal V supplied to the input of the analog-to-pulse rate converter means midway through the quantizing period for supplying unlike polarity average value power signals during respective half cycles of the quantizing period to cause an up/down integration of the average value power signal V over each quantizing period of operation of the analog-to-pulse rate converter means and simultaneously producing a sequential addition/subtraction of like polarity offset error signals over each quantizing period of operation to thereby cancel out the offset error signals automatically.

2. An improved electronic watt/watthour meter circuit according to claim 1 further including watthour indicator means coupled to the output from said analog-to-pulse rate converter means for deriving an output indication of the watthours of energy being supplied by the source of electric energy and watt indicator means coupled to the output from said multiplier low pass filter circuit means for deriving an indication of the watts of energy being supplied by the source.

3. An improved electronic watt/watthour meter circuit according to claim 1 wherein the transformer means which develops the signal proportional to the current supplied by the source of electric energy has a fixed resistor of predetermined value connected across the secondary winding of the transformer means for developing a voltage signal representative of the current supplied by the source of electric energy.

4. An improved electronic watt/watthour meter circuit according to claim 3 wherein the current proportional signal developed across the fixed resistor constitutes the second signal supplied to the input of the multiplier switching circuit means and the multiplier switching circuit means includes an additional set of switching means responsive to the output from the comparator means for supplying the product signal at the output from the multiplier switching circuit means to the input of the analog-to-pulse rate converter means via the low pass filter circuit means and the polarity reversing switching means of the automatic offset error correction circuit means.

5. An improved electronic watt/watthour meter circuit according to claim 4 further including watthour indicator means coupled to the output from said analog-to-pulse rate converter means for deriving an output indication of the watthours of energy being supplied by the source of electric energy and watt indicator means coupled to the output from said multiplier low pass filter circuit means for deriving an indication of the watts of energy being supplied by the source.

6. An improved electronic watt/watthour meter circuit according to claim 1 wherein the multiplier switching circuit means comprises a set of double pole-single throw switching means having reverse polarity second signal inputs supplied to the double pole inputs thereof for developing at the output opposite polarity pulse width modulated and amplitude modulated product signals which are supplied through respective multiplier low pass filter circuit means to the polarity reversing switching means comprising a part of the automatic offset error correction circuit means.

7. An improved electronic watt/watthour meter circuit according to claim 6 wherein the transformer means which develops the signal proportional to the current supplied by the source of electric energy has a fixed resistor of predetermined value connected across the secondary winding of the transformer means for developing a voltage signal representative of the current supplied by the source of electric energy, and wherein the current proportional signal developed across the fixed resistor constitutes the second signal supplied to the input of the multiplier switching circuit means and the multiplier switching circuit means further includes an additional set of switching means responsive to the output from the comparator means for supplying the product signal at first and second opposite polarity outputs from the multiplier switching circuit means to the input of the analog-to-pulse rate converter means via the low pass filter circuit means and the polarity reversing switching means of the offset error correction circuit means.

8. An improved electronic watt/watthour meter circuit according to claim 7 further including watthour indicator means coupled to the output from said analog-to-pulse rate converter means for deriving an output indication of the watthours of energy being supplied by the source of electric energy and watt indicator means coupled to the output from said multiplier low pass filter circuit means for deriving an indication of the watts of energy being supplied by the source.

9. An improved fast responding multi-phase electronic combined watthour and watt meter having analog and digital outputs with automatic error correction comprising:

first transformer means for each phase of a multiphase power supply having a primary winding connected to a respective single phase source of electric energy for excitation in response to either the electric current or the electric voltage supplied from that single phase source of electric energy and a secondary winding for providing a first signal proportional thereto;

second transformer means for each phase of the multi-phase power supply having a primary winding connected for excitation in response to the other of the electric current or electric voltage supplied from the respective single phase source of electric energy and secondary winding for providing a second signal proportional thereto;

multiplier circuit means for each phase of the multi-phase power supply for receiving and multiplying said first and second signals for the respective phase together and deriving an output product signal representative of instantaneous power being supplied by each phase of the multi-phase power supply;

each said multiplier circuit means comprising comparator means for receiving said first signal and a sampling signal from a common sampling signal source and deriving a pulse width modulated switching signal, and multiplier switching circuit means responsive to and controlled by said pulse width modulated switching signal and having the second signal supplied to an input thereof for supplying to an output load resistor a pulse width modulated and amplitude modulated product signal of the first and second signals and representative of the instantaneous power being supplied by the respective phase;

low pass filter circuit means coupled to the output from said multiplier circuit means for each phase of the multi-phase power supply for deriving from the pulse width modulated and amplitude modulated product signal an average value power signal P for each phase where $P = VI \cos \theta$ where V is the load voltage, I is the load circuit and $\theta$ is the load impedance phase angle;

common analog-to-pulse rate converter means having its input coupled to a summing resistor network comprised by all of the load resistors for each of the phases and responsive to the average value power signal V for all of the phases for summing and integrating the average power signals P of all of the phases and converting them into a train of output signal pulses wherein each output signal pulse represents a predetermined quantized amount of electric energy;

common automatic offset error correction circuit means responsive to the output from said common analog-to-pulse rate converter means for automatic addition/subtraction averaging of the system offset error signals during each quantizing period of operation of the common analog-to-pulse rate converter means, said common automatic offset error correction circuit means comprising polarity reversing switching means for each respective phase coupled intermediate the output from the respective phase low pass filter circuit means and the input to the common analog-to-pulse rate converter means with the polarity reversing switching means being responsive to the output from the common analog-to-pulse rate converter means for automatically switching the polarity of the average power supplied to the comparator means for each respective phase midway through the quantizing period of the analog-to-pulse rate converter means to thereby produce an up/down integration of unlike polarity average power signals from the output of the low pass filter circuit means in said summing resistor network over each quantizing period of operation of the analog-to-pulse rate converter means and simultaneously producing a sequential addition/subtraction of like polarity offset error signals in said summing resistor network over each quantizing period of operation for cancelling out the system offset error signals automatically; and common sampling signal generator means coupled to and supplying the pulse width modulating comparators for all of the phases.

10. An improved polyphase electronic watt/watthour meter according to claim 9 further including watthour indicator means coupled to the output from said common analog-to-pulse rate converter means for deriving an output indication of the watthours of energy being supplied by the source of electric energy and watt indicator means coupled to the output from said summing resistors for deriving an indication of the watts of energy being supplied by the polyphase source.

11. An improved electronic watt/watthour meter circuit according to claim 9 wherein the multiplier switching circuit means comprises a set of double pole-single throw switching means having reverse polarity second signal inputs supplied to the double pole inputs thereof for developing at the output opposite polarity pulse width modulated and amplitude modulated product signals which are supplied through respective multiplier low pass filter circuit means to the polarity reversing switching means comprising a part of the automatic offset error correction circuit means.

12. An improved electronic watt/watthour meter circuit according to claim 11 wherein the transformer means which develops the signal proportional to the current supplied by the source of electric energy has a fixed resistor of predetermined value connected across the secondary winding of the transformer means for developing a voltage signal representative of the current supplied by the source of electric energy, and wherein the current proportional signal developed across the fixed resistor constitutes the second signal supplied to the input of the multiplier switching circuit means and the multiplier switching circuit means further includes an additional set of switching means responsive to the output from the comparator means for supplying the product signal at first and second opposite polarity outputs from the multiplier switching circuit means to the input of the analog-to-pulse rate converter means via the low pass filter circuit means and the polarity reversing switching means of the offset error correction circuit means.

13. An improved polyphase electronic watt/watthour meter circuit according to claim 12 further including watthour indicator means coupled to the output from said common analog-to-pulse rate converter means for deriving an output indication of the watthours of energy being supplied by the polyphase source of electric energy and watt indicator means coupled to the output from said summing resistors for deriving an indication of the watts of energy being supplied by the polyphase source.

* * * * *